(12) United States Patent
Abessolo Bidzo

(10) Patent No.: US 11,101,264 B2
(45) Date of Patent: Aug. 24, 2021

(54) ELECTROSTATIC DISCHARGE PROTECTION CIRCUIT AND STRUCTURE THEREOF

(71) Applicant: NXP B.V., Eindhoven (NL)

(72) Inventor: Dolphin Abessolo Bidzo, Nijmegen (NL)

(73) Assignee: NXP B.V., Eindhoven (NL)

( * ) Notice: Subject to any disclaimer, the term of this patent is extended or adjusted under 35 U.S.C. 154(b) by 92 days.

(21) Appl. No.: 16/540,303

(22) Filed: Aug. 14, 2019

(65) Prior Publication Data

US 2021/0050340 A1 Feb. 18, 2021

(51) Int. Cl.
| | |
|---|---|
| *H01L 27/02* | (2006.01) |
| *H02H 9/04* | (2006.01) |
| *H02H 11/00* | (2006.01) |
| *H02H 9/02* | (2006.01) |

(52) U.S. Cl.
CPC ........ *H01L 27/027* (2013.01); *H01L 27/0255* (2013.01); *H01L 27/0292* (2013.01); *H01L 27/0296* (2013.01); *H02H 9/025* (2013.01); *H02H 9/046* (2013.01); *H02H 11/003* (2013.01)

(58) Field of Classification Search
CPC ............... H01L 27/0688; H01L 27/027; H01L 27/0292; H01L 27/0296; H01L 27/0255; H02H 9/025; H02H 11/003; H02H 9/043; H02H 9/046
USPC ............................................ 365/226; 361/56
See application file for complete search history.

(56) References Cited

U.S. PATENT DOCUMENTS

| | | | |
|---|---|---|---|
| 7,023,676 B2 | 4/2006 | Ker et al. | |
| 7,049,663 B2 | 5/2006 | Wang | |
| 7,995,316 B2 | 8/2011 | Carpenter, Jr. et al. | |
| 8,217,421 B2 | 7/2012 | Chen et al. | |
| 8,334,575 B2 * | 12/2012 | Laine ............... | H03K 17/08122 257/379 |
| 9,269,703 B2 | 2/2016 | Pok et al. | |
| 9,917,079 B2 | 3/2018 | Tsai et al. | |
| 2014/0334048 A1 | 11/2014 | Muhonen | |

* cited by examiner

*Primary Examiner* — Dharti H Patel

(57) ABSTRACT

An electrostatic-discharge (ESD) protection circuit is provided. The circuit includes an I/O terminal coupled for receiving a signal having a negative voltage relative to a voltage supply terminal. An ESD transistor is formed in an isolated well. The transistor includes a control electrode and a first current electrode coupled to the I/O terminal. The isolated well is configured as a body electrode of the transistor. An ESD diode includes an anode electrode coupled to the voltage supply terminal and a cathode electrode coupled to a second current electrode of the transistor.

20 Claims, 4 Drawing Sheets

ELECTROSTATIC DISCHARGE PROTECTION CIRCUIT AND STRUCTURE THEREOF

BACKGROUND

Field

This disclosure relates generally to electronic circuits, and more specifically, to electrostatic discharge (ESD) protection circuit and structure.

Related Art

Today, many modern electronic devices are designed with ever increasing complexity. Many of these electronic devices are at risk of damage due to electrostatic discharge (ESD) events. Such ESD events may occur in the manufacturing process, during assembly and testing, or in the ultimate system and field application. However, conventional ESD protection schemes for protecting internal elements from damage may impact the performance of non-standard inputs and outputs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an ESD protection circuit for a negative voltage input/output (I/O). The negative voltage I/O is configured to output or receive negative voltage signals (e.g., −4.0 volts to 0 volts) relative to ground such as in high frequency (up to 30 GHz and greater) radar, wireless LAN, and satellite communications applications, for example. The ESD protection circuit provides for more robust ESD protection by utilizing isolated transistor and diode structures which eliminate parasitic silicon-controlled rectifier (SCR) action associated with other ESD protection techniques.

Figure 1:
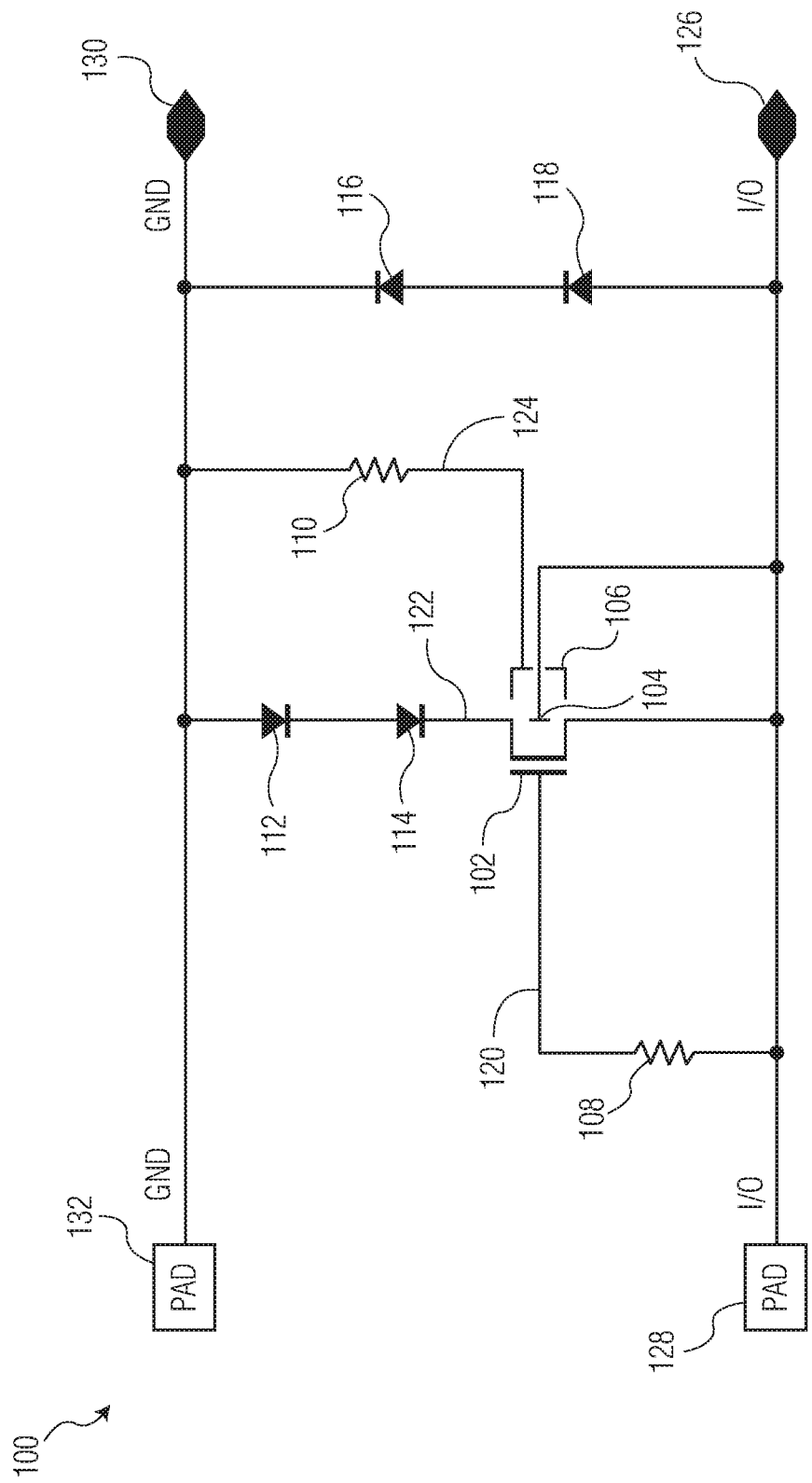
FIG. 1 illustrates, in simplified schematic diagram form, an example implementation of an ESD protection circuit for a negative voltage input or output in accordance with an embodiment.

FIG. 1 illustrates, in simplified schematic diagram form, an example implementation of an ESD protection circuit 100 for a negative voltage input in accordance with an embodiment. ESD protection circuit 100 is implemented as an integrated circuit and includes a ground voltage supply terminal 130 labeled GND connected to bonding pad or bump pad 132 by way of node GND and an input/output (I/O) terminal 126 connected to bonding pad 128 by way of node I/O. The ESD protection circuit 100 further includes an ESD protection transistor 102, ESD protection diodes 112-118, and resistors 108 and 110. For illustrative purposes, circuitry and features which may be commonly coupled at the I/O node such as input buffer circuitry and output driver circuitry are not shown. In this embodiment, I/O node and associated circuitry coupled to pad 128 are configured and arranged for receiving and/or outputting a signal which has a negative voltage waveform relative to the GND node.

Transistor 102 is formed as a five-electrode isolated N-channel MOS transistor having parameters (e.g., length, width, gate oxide thickness, etc.) configured for withstanding ESD events. A first current electrode and a body electrode 104 of transistor 102 are connected at the I/O node. A first terminal of a first resistor 108 is connected to a control electrode of transistor 102 at node 120 and a second terminal of the first resistor 108 is connected at the I/O node. A first terminal of a second resistor 110 is connected to a body isolation electrode 106 of transistor 102 at node 124 and a second terminal of the second resistor 110 is connected at the GND node.

Diodes 112-118 are formed as isolated P-N junction diodes having parameters (e.g., junction length, width, perimeter, area, etc.) configured for withstanding ESD events. A first diode string is connected between the GND node and a second current electrode of transistor 102 at node 122. In this embodiment, the first diode string includes two series connected diodes (e.g., diodes 112, 114). In other embodiments, the first diode string may include any suitable number of ESD protection diodes. An anode electrode of diode 112 is connected at the GND node and a cathode electrode of diode 112 is connected to an anode electrode of diode 114. A cathode electrode of diode 114 is connected to the second current electrode of transistor 102 at node 122. A second diode string is connected between the GND node and the I/O node. In this embodiment, the second diode string includes two series connected diodes (e.g., diodes 116, 118). In other embodiments, the second diode string may include any suitable number of ESD protection diodes. An anode electrode of diode 118 is connected at the I/O node and a cathode electrode of diode 118 is connected to an anode electrode of diode 116. A cathode electrode of diode 116 is connected at the GND node.

Figure 2:
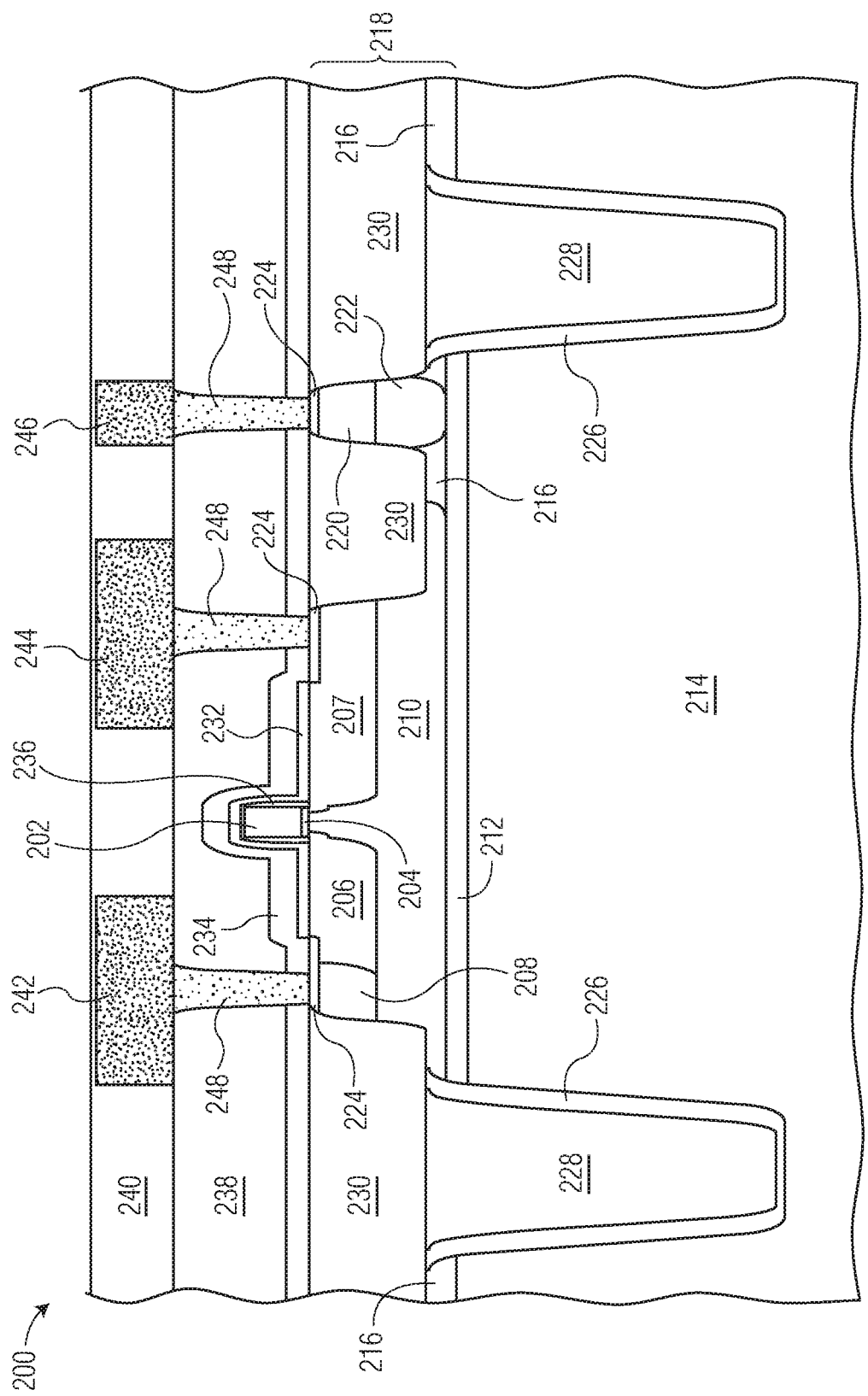
FIG. 2 illustrates, in simplified cross-sectional view, an example structure of an isolated ESD protection transistor in accordance with an embodiment.

FIG. 2 illustrates, in simplified cross-sectional view, an example structure of a five-electrode isolated ESD protection N-channel transistor 200 in accordance with an embodiment. The example transistor 200 depicted in FIG. 2 corresponds to five-electrode transistor 102 depicted in FIG. 1.

Transistor 200 is formed in an isolated P-well 210 in an epitaxial layer 218 on a first portion of a P-type semiconductor substrate 214. The isolated well 210 serves as a body electrode and corresponds to the body electrode 104 depicted in FIG. 1. Transistor 200 includes a gate electrode 202 typically formed from a polysilicon material and may be alternatively formed from other suitable conductive materials. The gate electrode 202 is formed over a gate dielectric 204 (e.g., gate oxide). Gate dielectric 204 may be formed from any suitable dielectric material such as a grown or deposited oxide material. A spacer oxide layer 236 is formed over the gate electrode 202 and gate oxide 204. Transistor 200 further includes a first current electrode 206 formed as an N+ implanted source region 206 and a second current electrode 207 formed as an N+ implanted drain region 207, forming a channel below the gate dielectric 204. The first current electrode 206 and the second current electrode 207 correspond to the first and second current electrodes, respectively, provided in the description of FIG. 1 above. A P+ well tie region 208 is formed adjacent to the source region 206 of transistor 200 and provides connectivity with the isolated well 210. The isolated well 210 of transistor 200 is formed over a buried N-well 212 forming a body isolation electrode 212 of transistor 200 which isolates the isolated well 210 from substrate 214. A stacked well tie region formed by N+ region 220 and deep N-well region 222 provides connectivity with the buried well 212.

Shallow trench isolation (STI) structures 230 are formed between the drain region 207 and the stacked well tie region and substantially surrounding transistor 200. STI 230 may be formed from any suitable dielectric material such as a deposited oxide material, for example. Deep trench isolation (DTI) structures 228 are formed substantially surrounding transistor 200 and adjacent to epitaxial layer regions 216. DTI 228 may be formed with a grown oxide layer 226 followed by a deposited non-conductive material, for example. In this embodiment, the DTI 228 isolates transistor 200 from other circuit components such as diodes 112-118, for example.

A silicide blockage layer 232 is formed over the spacer oxide 236 and portions of the source/drain regions 206-207. Silicide regions 224 are formed on portions of the source/drain regions 206-207, well tie region 208, and N+ region 220 of the stacked well tie not blocked by the silicide blockage layer 232. An inter-level dielectric layer (ILD) 234 is formed over the silicide blockage layer 232, silicide regions 224, and STI 230. Inter-metal dielectric layers (IMD) 238-240 are formed respectively over the ILD layer 234. Contact regions 248 provide connectivity between metal layer portions 242-246 and silicide regions 224. For example, a conductive path is formed from metal layer portion 242 to well tie 208 and source region 206 allowing for electrical connection to the first current electrode 206 and the isolated well 210 (e.g. body electrode) of transistor 200. Likewise, a conductive path is formed from metal layer portion 244 to drain region 207 allowing for electrical connection to the second current electrode of transistor 200. Another conductive path is formed from metal layer portion 246 to the N+ region 220 of the stacked well tie allowing for electrical connection to the buried N-well 212 (e.g., body isolation electrode) of transistor 200.

The gate electrode 202, first and second current electrodes 206 and 207 (e.g., source/drain regions 206-207), body electrode 210 (e.g., isolated well 210), and body isolation electrode 212 (e.g., buried well 212) are characterized as the five electrodes of N-channel transistor 200 corresponding to five-electrode transistor 102 depicted in FIG. 1.

Figure 3:
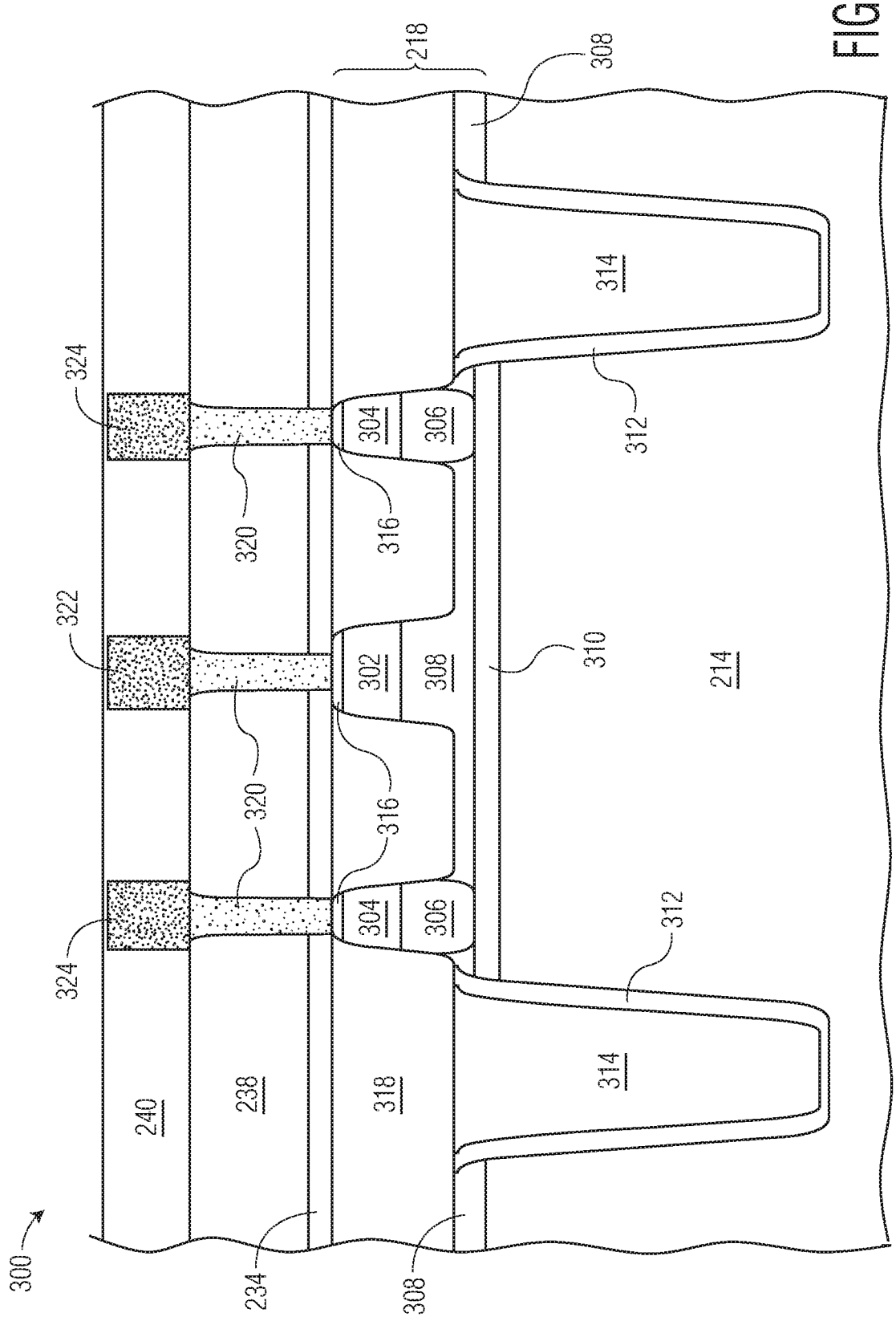
FIG. 3 illustrates, in simplified cross-sectional view, an example structure of an isolated ESD protection diode in accordance with an embodiment.

FIG. 3 illustrates, in simplified cross-sectional view, an example structure of an isolated ESD protection diode 300 in accordance with an embodiment. The example diode 300 depicted in FIG. 3 is representative of each of the diodes 112-118 depicted in FIG. 1.

Diode 300 is formed in the epitaxial layer 218 on a second portion of semiconductor substrate 214. Diode 300 is formed over a buried N-well region 310 formed over substrate 214. Diode 300 includes an anode electrode formed as a P+ implanted region 302 and a cathode electrode formed as stacked N+ implanted regions 304 and deep N-well regions 306 tied to buried well 310. The anode electrode and the cathode electrode correspond to the anode and cathode electrodes of diodes 112-118, respectively, provided in the description of FIG. 1 above. In this embodiment, the cathode electrode formed by stacked N+ regions 304 and deep N-well regions 306 substantially surround the anode electrode forming a substantially continuous connection with buried well 310

Shallow trench isolation (STI) structures 318 are formed between region 302 (e.g., anode electrode) and stacked regions 304 and 306 (e.g., cathode electrode) and substantially surrounding diode 300. STI 318 may be formed from any suitable dielectric material such as a deposited oxide material, for example. Deep trench isolation (DTI) structures 314 are formed substantially surrounding diode 300 and adjacent to epitaxial layer regions 308. DTI 314 may be formed with a grown oxide layer 312 followed by a deposited non-conductive material, for example. In this embodiment, the DTI 314 isolates diode 300 from transistor 200, for example.

Silicide regions 316 are formed on anode region 302 and cathode regions 304. The inter-level dielectric layer (ILD) 234 is formed over portions of silicide regions 316 and STI 318. Inter-metal dielectric layers (IMD) 238-240 are formed respectively over the ILD layer 234. Contact regions 320 provide connectivity between metal layer portions 322-324 and silicide regions 316. For example, a conductive path is formed from metal layer portion 322 to P+ region 302 allowing for electrical connection to the anode electrode of diode 300. Likewise, a conductive path is formed from metal layer portions 324 to N+ regions 304 and deep N-well regions 306 tied to buried well 310 allowing for electrical connection to the cathode electrode of diode 300.

Figure 4:
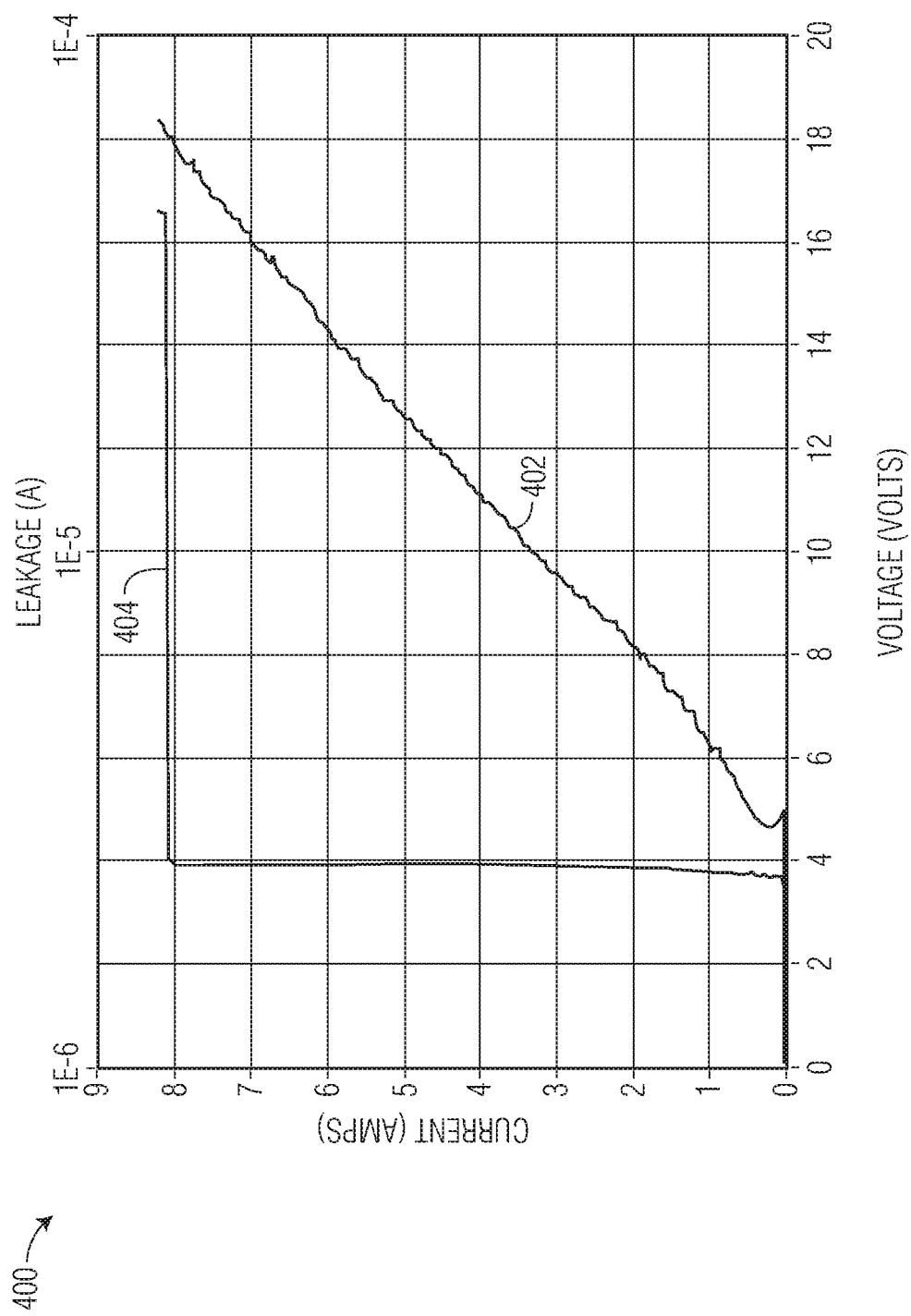
FIG. 4 illustrates, in plot diagram form, example characterization results of the ESD protection circuit of FIG. 1 in accordance with an embodiment.

FIG. 4 illustrates, in plot diagram form, example transmission line pulse (TLP) characterization results of the ESD protection circuit 100 of FIG. 1 in accordance with an embodiment. The plot diagram 400 includes an I/V waveform 402 and corresponding leakage direct current (DC) waveform 404 depicting TLP characterization of circuit 100 with the I/O node grounded and the GND node ESD zapped. The I/V waveform 402 is shown with current values in amps on the Y-axis and voltage values in volts on the bottom X-axis, and the leakage current waveform 404 is shown with current values in amps on the top X-axis.

In this embodiment, the I/V waveform 402 depicts a parasitic lateral bipolar action of the transistor 102 that triggers when the voltage at the GND node reaches approximately 4.9 volts and snaps back with a holding voltage of approximately 4.5 volts. The dynamic resistance is calculated at approximately 1.5 ohms. As voltage is increased, current tracks substantially linear until approximately 18 volts and 8 amps. Beyond approximately 18 volts and 8 amps, the leakage current waveform 404 depicts a significant increase in leakage current indicative of circuit 100 reaching a permanent failure point.

Because the ESD protection transistor 102 is formed as a five-electrode isolated transistor and the ESD protection diodes 112-114 are formed as isolated diodes, when connected in series as provided in FIG. 1, a parasitic thyristor formed is significantly weakened by the isolation (e.g., DTI structures 228, 314 of FIGS. 2, 3) allowing only the intended parasitic bipolar action of transistor 102 to be triggered under an ESD event. As illustrated in FIG. 4, there is no discernible silicon-controlled rectifier (SCR) action observed, exemplifying a more robust ESD protection circuit 100.

Generally, there is provided, a circuit including an input/output (I/O) terminal coupled for receiving a signal having a negative voltage relative to a voltage supply terminal; an electrostatic-discharge (ESD) transistor formed in an isolated well, the ESD transistor having a control electrode and a first current electrode coupled to the I/O terminal, the isolated well configured as a body electrode of the ESD transistor; and a first ESD diode having an anode electrode coupled to the voltage supply terminal and a cathode electrode coupled to a second current electrode of the ESD transistor. The ESD transistor formed in the isolated well may be formed in a first portion of a semiconductor substrate and the first ESD diode may be formed in a second portion of the semiconductor substrate, the first portion isolated from the second portion by way of a deep trench isolation (DTI) structure. The first ESD diode may be configured and arranged with the anode electrode surrounded by the cathode electrode, the cathode electrode surrounded by a DTI structure. The circuit may further include a second ESD diode having an anode electrode coupled to the I/O terminal and a cathode electrode coupled to the voltage supply terminal. The circuit may further include a well tie region formed in the isolated well having a same conductivity type as the isolated well, the well tie region coupled to the voltage supply terminal. The isolated well may be formed over a buried well having a conductivity type opposite of the isolated well, the buried well coupled to the I/O terminal by way of a deep well implant region. The control electrode may be coupled to the I/O terminal by way of a first resistor, a first terminal of the first resistor coupled at the control electrode and a second terminal of the first resistor coupled at the I/O terminal. The body electrode may be coupled to the voltage supply terminal by way of a second resistor, a first terminal of the second resistor coupled at the body electrode and a second terminal of the second resistor coupled at the voltage supply terminal. The cathode electrode of the first ESD diode may be coupled to the second current electrode of the ESD transistor by way of a second ESD diode, the second ESD diode having an anode electrode coupled to the cathode electrode of the first ESD diode and a cathode electrode coupled to the second current electrode of the ESD transistor.

In another embodiment, there is provided, a circuit including an input/output (I/O) terminal coupled for receiving a signal having a negative voltage relative to a voltage supply terminal; an electrostatic-discharge (ESD) transistor formed in an isolated well coupled to the voltage supply terminal, the ESD transistor having a control electrode and a first current electrode coupled to the I/O terminal, the isolated well configured as a body electrode of the ESD transistor; and a first ESD diode having an anode electrode coupled to the voltage supply terminal and a cathode electrode coupled to a second current electrode of the ESD transistor. The isolated well may be formed over a buried well having a conductivity type opposite of the isolated well, the buried well coupled to the I/O terminal by way of a deep well implant region. The circuit may further include a second ESD diode having an anode electrode coupled to the I/O terminal and a cathode electrode coupled to the voltage supply terminal. The circuit may further include a first resistor configured to couple the control electrode to the I/O terminal, a first terminal of the first resistor coupled at the control electrode and a second terminal of the first resistor coupled at the I/O terminal. The circuit may further include a second resistor configured to couple the body electrode to the voltage supply terminal, a first terminal of the second resistor coupled at the body electrode and a second terminal of the second resistor coupled at the voltage supply terminal. The isolated well may be formed in an epitaxial (EPI) layer of a semiconductor substrate and may be isolated by way of a deep trench isolation (DTI) structure. The first ESD diode may be configured and arranged with the anode electrode substantially surrounded by the cathode electrode, the cathode electrode coupled to a buried well underlying the anode electrode.

In yet another embodiment, there is provided, a circuit including an input/output (I/O) terminal coupled for receiving a signal having a negative voltage relative to a voltage supply terminal; a buried well having a first conductivity type formed in an epitaxial (EPI) layer of a semiconductor substrate, the buried well coupled to the I/O terminal; an isolated well having a second conductivity type formed over the buried well, the isolated well coupled to the voltage supply terminal; an electrostatic-discharge (ESD) transistor formed in the isolated well, the ESD transistor having a control electrode and a first current electrode coupled to the I/O terminal, the isolated well configured as a body electrode of the ESD transistor; and a first ESD diode having an anode electrode coupled to the voltage supply terminal and a cathode electrode coupled to a second current electrode of the ESD transistor. The buried well may be configured and arranged to isolate the isolated well from the semiconductor substrate, the semiconductor substrate having the second conductivity type. The anode electrode of the first ESD diode may be formed having the first conductivity type and the cathode electrode of the first ESD diode may be formed having the second conductivity type, the first ESD diode isolated from the ESD transistor by way of a deep trench isolation (DTI) structure. The circuit may further include a second ESD diode having an anode electrode coupled to the I/O terminal and a cathode electrode coupled to the voltage supply terminal.

By now it should be appreciated that there has been provided, an ESD protection circuit for a negative voltage input/output (I/O). The negative voltage I/O is configured to output or receive negative voltage signals (e.g., −4.0 volts to 0 volts) relative to ground such as in high frequency (up to 30 GHz and greater) radar, wireless LAN, and satellite communications applications, for example. The ESD protection circuit provides for more robust ESD protection by utilizing isolated transistor and diode structures which eliminate parasitic silicon-controlled rectifier (SCR) action associated with other ESD techniques.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   an input/output (I/O) terminal coupled for receiving a signal having a negative voltage relative to a voltage supply terminal;
   an electrostatic-discharge (ESD) transistor formed in an isolated well, the ESD transistor having a control electrode and a first current electrode coupled to the I/O terminal, the isolated well configured as a body electrode of the ESD transistor;
   a well tie region formed in the isolated well having a same conductivity type as the isolated well, the well tie region coupled to the voltage supply terminal; and
   a first ESD diode having an anode electrode coupled to the voltage supply terminal and a cathode electrode coupled to a second current electrode of the ESD transistor.

2. The circuit of claim 1, wherein the ESD transistor formed in the isolated well is formed in a first portion of a semiconductor substrate and the first ESD diode is formed in a second portion of the semiconductor substrate, the first portion isolated from the second portion by way of a deep trench isolation (DTI) structure.

3. The circuit of claim 1, wherein the first ESD diode is configured and arranged with the anode electrode surrounded by the cathode electrode, the cathode electrode surrounded by a DTI structure.

4. The circuit of claim 1, further comprising a second ESD diode having an anode electrode coupled to the I/O terminal and a cathode electrode coupled to the voltage supply terminal.

5. The circuit of claim 1, wherein the isolated well is formed over a buried well having a conductivity type opposite of the isolated well, the buried well coupled to the I/O terminal by way of a deep well implant region.

6. The circuit of claim 1, wherein the control electrode is coupled to the I/O terminal by way of a first resistor, a first terminal of the first resistor coupled at the control electrode and a second terminal of the first resistor coupled at the I/O terminal.

7. The circuit of claim 1, wherein the body electrode is coupled to the voltage supply terminal by way of a second resistor, a first terminal of the second resistor coupled at the body electrode and a second terminal of the second resistor coupled at the voltage supply terminal.

8. The circuit of claim 1, wherein the cathode electrode of the first ESD diode is coupled to the second current electrode of the ESD transistor by way of a second ESD diode, the second ESD diode having an anode electrode coupled to the cathode electrode of the first ESD diode and a cathode electrode coupled to the second current electrode of the ESD transistor.

9. A circuit comprising:
   an input/output (I/O) terminal coupled for receiving a signal having a negative voltage relative to a voltage supply terminal;
   an electrostatic-discharge (ESD) transistor formed in an isolated well coupled to the voltage supply terminal, the ESD transistor having a control electrode and a first current electrode coupled to the I/O terminal, the isolated well configured as a body electrode of the ESD transistor, wherein the isolated well is formed over a buried well having a conductivity type opposite of the isolated well, the buried well coupled to the I/O terminal by way of a deep well implant region; and
   a first ESD diode having an anode electrode coupled to the voltage supply terminal and a cathode electrode coupled to a second current electrode of the ESD transistor.

10. The circuit of claim 9, further comprising a second ESD diode having an anode electrode coupled to the I/O terminal and a cathode electrode coupled to the voltage supply terminal.

11. The circuit of claim 9, further comprising a first resistor configured to couple the control electrode to the I/O terminal, a first terminal of the first resistor coupled at the control electrode and a second terminal of the first resistor coupled at the I/O terminal.

12. The circuit of claim 9, further comprising a second resistor configured to couple the body electrode to the voltage supply terminal, a first terminal of the second resistor coupled at the body electrode and a second terminal of the second resistor coupled at the voltage supply terminal.

13. The circuit of claim 9, wherein the isolated well is formed in an epitaxial (EPI) layer of a semiconductor substrate and is isolated by way of a deep trench isolation (DTI) structure.

14. The circuit of claim 13, wherein the first ESD diode is configured and arranged with the anode electrode substantially surrounded by the cathode electrode, the cathode electrode coupled to a buried well underlying the anode electrode.

15. A circuit comprising:
   an input/output (I/O) terminal coupled for receiving a signal having a negative voltage relative to a voltage supply terminal;
   a buried well having a first conductivity type formed in an epitaxial (EPI) layer of a semiconductor substrate, the buried well coupled to the I/O terminal;
   an isolated well having a second conductivity type formed over the buried well, the isolated well coupled to the voltage supply terminal;
   an electrostatic-discharge (ESD) transistor formed in the isolated well, the ESD transistor having a control electrode and a first current electrode coupled to the I/O terminal, the isolated well configured as a body electrode of the ESD transistor; and
   a first ESD diode having an anode electrode coupled to the voltage supply terminal and a cathode electrode coupled to a second current electrode of the ESD transistor.

16. The circuit of claim 15, wherein the buried well is configured and arranged to isolate the isolated well from the semiconductor substrate, the semiconductor substrate having the second conductivity type.

17. The circuit of claim 15, wherein the anode electrode of the first ESD diode is formed having the first conductivity type and the cathode electrode of the first ESD diode is formed having the second conductivity type, the first ESD diode isolated from the ESD transistor by way of a deep trench isolation (DTI) structure.

18. The circuit of claim 15, further comprising a second ESD diode having an anode electrode coupled to the I/O terminal and a cathode electrode coupled to the voltage supply terminal.

19. A circuit comprising:
an input/output (I/O) terminal coupled for receiving a signal having a negative voltage relative to a voltage supply terminal;
an electrostatic-discharge (ESD) transistor formed in an isolated well, the ESD transistor having a control electrode and a first current electrode coupled to the I/O terminal, the isolated well formed over a buried well having a conductivity type opposite of the isolated well and configured as a body electrode of the ESD transistor, the buried well coupled to the I/O terminal by way of a deep well implant region; and
a first ESD diode having an anode electrode coupled to the voltage supply terminal and a cathode electrode coupled to a second current electrode of the ESD transistor.

20. The circuit of claim 19, wherein the first ESD diode is configured and arranged with the anode electrode surrounded by the cathode electrode, the cathode electrode surrounded by a deep trench isolation (DTI) structure.

* * * * *